US012723310B2

(12) United States Patent
Winter

(10) Patent No.: US 12,723,310 B2
(45) Date of Patent: Sep. 1, 2026

(54) CHEMICAL VAPOUR DEPOSITION (CVD) REACTOR

(71) Applicant: Sicona Battery Technologies Pty Ltd, North Wollongong (AU)

(72) Inventor: John Winter, Glenn Innes (AU)

(73) Assignee: Sicona Battery Technologies Pty Ltd, North Wollongong (AU)

(*) Notice: Subject to any disclaimer, the term of this patent is extended or adjusted under 35 U.S.C. 154(b) by 0 days.

(21) Appl. No.: 18/581,853

(22) Filed: Feb. 20, 2024

(65) Prior Publication Data

US 2024/0240312 A1 Jul. 18, 2024

Related U.S. Application Data

(63) Continuation of application No. PCT/AU2024/050018, filed on Jan. 12, 2024.

(30) Foreign Application Priority Data

Jan. 16, 2023 (AU) ................................ 2023900088

(51) Int. Cl.

| | |
|---|---|
| ***C23C 16/442*** | (2006.01) |
| ***C01B 32/21*** | (2017.01) |
| ***C23C 16/26*** | (2006.01) |
| ***C23C 16/44*** | (2006.01) |
| ***C23C 16/455*** | (2006.01) |
| ***C23C 16/52*** | (2006.01) |
| ***H01M 4/36*** | (2006.01) |
| ***H01M 4/587*** | (2010.01) |
| ***H01M 4/62*** | (2006.01) |

(52) U.S. Cl.

CPC ............ *C23C 16/442* (2013.01); *C01B 32/21* (2017.08); *C23C 16/26* (2013.01); *C23C 16/4417* (2013.01); *C23C 16/45519* (2013.01); *C23C 16/52* (2013.01); *H01M 4/366* (2013.01); *H01M 4/587* (2013.01); *H01M 4/625* (2013.01); *C01P 2004/84* (2013.01); *C01P 2006/40* (2013.01)

(58) Field of Classification Search

CPC ... C23C 16/442; C23C 16/26; C23C 16/4417; C23C 16/45519; C23C 16/52; C01B 32/21; H01M 4/366; H01M 4/587; H01M 4/625; C01P 2004/84; C01P 2006/40

See application file for complete search history.

(56) References Cited

U.S. PATENT DOCUMENTS

| | | | | |
|---|---|---|---|---|
| 11,434,566 | B2 * | 9/2022 | Kim | B01J 19/243 |
| 2008/0247939 | A1 | 10/2008 | Iyuke | |
| 2021/0002764 | A1 | 1/2021 | Kim | |

FOREIGN PATENT DOCUMENTS

| | | | | |
|---|---|---|---|---|
| JP | 2012519773 A * | 8/2012 | | |
| JP | 2019006674 A | 1/2019 | | |
| WO | WO-2010100235 A1 * | 9/2010 | | B01J 8/18 |
| WO | WO-2015163820 A1 * | 10/2015 | | B82Y 30/00 |
| WO | WO-2022030674 A1 * | 2/2022 | | |

* cited by examiner

*Primary Examiner* — Jeffrie R Lund

(74) *Attorney, Agent, or Firm* — Dickinson Wright PLLC

(57) ABSTRACT

The present invention relates to a CVD reactor, particularly an entrained flow reactor, for preparing particulate materials. The invention also relates to a method of preparing such materials using a CVD reactor, particularly an entrained flow reactor. The invention further relates to electrode materials, electrodes and alkali metal-ion batteries comprising the particulate materials.

12 Claims, 3 Drawing Sheets

CHEMICAL VAPOUR DEPOSITION (CVD) REACTOR

RELATED APPLICATION

The present application is a continuation of PCT International Application No. PCT/AU2024/050018, filed 12 Jan. 2024, which claims priority to Australian Provisional Patent Application No. AU2023900088, filed 16 Jan. 2023, all of which are incorporated by reference in its entirety.

FIELD OF THE INVENTION

The present invention relates to a CVD reactor, particularly to an entrained flow reactor. In particular, the present invention relates to an entrained flow reactor for preparing particulate materials. However, it will be appreciated that the invention is not limited to these particular fields of use.

BACKGROUND OF THE INVENTION

The following discussion of the prior art is provided to place the invention in an appropriate technical context and enable the advantages of it to be more fully understood. It should be appreciated, however, that any discussion of the prior art throughout the specification should not be considered as an express or implied admission that such prior art is widely known or forms part of the common general knowledge in the field.

Particulate materials are used in a wide range of industrial applications. For example, carbonaceous particulate materials including graphite powder, carbon black and coke can be used as an electrode material in alkali metal-ion batteries because it provides advantages such as low working potential, higher electrical conductivity, longer cycle life and relatively low cost. Other particulate materials for such batteries include metallic lithium, lithium titanate and silicon and/or their carbonaceous composites.

However, the use of particulate materials, such as graphite, has limitations. Firstly, during the manufacture process of a battery, a portion of the alkali metal forms a stable solid electrolyte interface on the graphite surface, which leads to a coulombic efficiency of only about 80%-93% in the first charging/discharging cycle and a permanent capacity loss in the battery. In order to address this issue, graphite with low surface area is normally preferred due to its lower extent of electrolyte decomposition reactions. Secondly, graphite generally has a poor rate performance especially at reduced temperature where alkali metal deposition may occur. In order to address this issue, graphite particle size needs to be reduced to facilitate solid-state alkali metal diffusion, leading to higher delivered capacity at high rates. However, this inevitably involves using graphite with higher surface area, which leads to the capacity loss as described above. Other factors including particle morphology, electrode thickness, porosity, choice of binder, and electrolyte composition affect the rate capability of graphite-based electrode materials.

Silicon is considered as a promising alternative electrode material. However, it generally suffers from enormous volume change (in the order of 300%) during the lithiation and de-lithiation process, causing cracking and pulverisation of active materials, followed by disintegration of the electrode and leading to rapid degradation of capacity.

It has been suggested that the surface of the particulate materials may be modified via polymers, metals or carbon coating to overcome some of the issues described above. For example, it has been reported that isotropic amorphous carbon allows random lithium ion intercalation, which may lead to improved rate capacity in batteries with carbon-coated graphite electrodes. Further, improved cycling performance has been observed in batteries with carbon-coated graphite electrodes in electrolytes containing propylene carbonate. Yet further still, silicon particles coated with carbon have been shown to improve the performance of an alkali ion battery.

PCT application WO 2015197005 discloses a method of modifying carbon nanotubes using cyclopentadiene. In some embodiments, the carbon nanotubes are fluidised and the reaction takes place in a tubular reactor.

PCT application WO 2016135328 discloses a surface-modified carbonaceous material with nanoparticles attached to the surface of the material and processes for preparing such carbonaceous material. In one embodiment, the carbonaceous particles are modified on their surface by depositing nanoparticles on the surface in a plasma reactor. For example, the nanoparticles are attached to the surface of the carbonaceous particles by plasma enhanced chemical vapor deposition in the presence of hydrocarbons. In some embodiments, the residence time of the particles is in the range of 0.05 to 0.5 seconds.

PCT application WO 2016008951 discloses a surface-modified carbonaceous particulate material having a hydrophilic non-graphitic carbon coating. In some embodiments, the coating process is carried out in a fluidised bed reactor using chemical vapour deposition process.

Korean patent application KR 101776246 discloses a negative active material for a lithium secondary battery, and specifically, a material expressing a high capacity in the form of a structure in which a plurality of nanostructures is aggregated, wherein at least a portion of the structure forms a composite in a form bonded to a carbon-based support, and a carbon coating layer is located on the surface of the structure and/or the carbon-based support. The deposition process takes places in an unspecified reactor in the presence of a hydrocarbon gas.

Han and Lee ("improvement on the electrochemical characteristics of graphite anodes by coating of the pyrolytic carbon using tumbling chemical vapour deposition" *Electrochimica Acta*, Vol. 48, Issue 8, pp. 1073-1079) disclose graphite coated with pyrolytic carbon materials using the tumbling chemical vapor deposition process.

Other representative prior art includes but is not limited to CN 112755994, WO 2016/045937, CN 113751003, CN 105600784, WO 2012/048185, WO 0012447, WO 2020/073101, JP 2004244690, U.S. Pat. Nos. 7,750,194, 5,431,968 and 8,980,195.

In order to modify the surface of a particulate material, the particulate material is preferably homogeneously fluidised before modification. In order to achieve good fluidisation behaviour, a broad particle size distribution is preferable. For coarser particles, this may result in uneven deposition of coating materials on particles. Further, finer particles, when fluidised, have the tendency to leave the reactor without surface modification or with partial surface modification, as the residence time of finer particles is shorter compared to that of coarser particles.

It is an object of the present invention to overcome or ameliorate at least one of the disadvantages of the prior art, or to provide a useful alternative.

It is an object of an especially preferred form of the present invention to provide for a new or improved CVD reactor, particularly an entrained flow reactor for preparing a surface-modified particulate material, a method of preparing such materials, electrode materials and/or electrodes and/or alkali metal-ion batteries comprising such materials.

Unless the context clearly requires otherwise, throughout the description and the claims, the words “comprise”, “comprising”, and the like are to be construed in an inclusive sense as opposed to an exclusive or exhaustive sense; that is to say, in the sense of “including, but not limited to”.

Although the invention will be described with reference to specific examples it will be appreciated by those skilled in the art that the invention may be embodied in many other forms.

SUMMARY OF THE INVENTION

According to a first aspect of the invention there is provided a CVD reactor for preparing a particulate material, the reactor comprising:

- a first inlet conduit; and
- a first bend having one end located at the end of the first inlet conduit, and another end located at the start of a first outlet conduit, wherein the particulate material is prepared by flowing a feed material through the inlet conduit and the outlet conduit while in contact with a hydrocarbon gas mixed with an inert gas at a temperature of between about 500° C. to about 1500° C.

In some embodiments, the CVD reactor is an entrained flow reactor.

Advantageously, the present inventors have developed a CVD reactor, particularly an entrained flow reactor, for preparing a particulate material including materials of finer particle sizes, and/or a tight/narrow particle size distribution. This is achieved by flowing the particulate material through a serpentine/sinusoidal pathway comprising the inlet conduit, the bend and the outlet conduit as described above, such that the particulate materials, especially the materials with finer particle sizes, have sufficient time to react with the hydrocarbon gas while travelling through the serpentine/sinusoidal pathway. Due to the limited possibility for material back mixing, the reactor approaches theoretical plug flow regime. The skilled person would understand that a plug-flow reactor provides good continuous solids residence time control. Continuous feed and discharge would allow good steady-state control.

In another aspect, the invention relates to a CVD reactor for use or when used to prepare a particulate material, the reactor comprising:

- a first inlet conduit; and
- a first bend having one end located at the end of the first inlet conduit, and another end located at the start of a first outlet conduit, wherein the particulate material is prepared by flowing a feed material through the inlet conduit and the outlet conduit while in contact with a hydrocarbon gas mixed with an inert gas at a temperature of between about 500° C. to about 1500° C.

In an embodiment, the particulate material is a surface-modified particulate material.

In an embodiment of the invention, the reactor is preferably arranged in a vertical orientation, which further ensures that particles of all sizes move through at the same rate on average with respect to the gas phase (i.e. larger particles may rise slower but fall faster, therefore after completing one loop the average residence time for all particles will be similar).

Residence Time

The person skilled in the art would appreciate that as the size (and weight) of a particulate material decrease, its residence time in a reactor decreases accordingly. In other words, materials with finer particles sizes may not have sufficient time to be in contact with the hydrocarbon gas, leading to incomplete/partial reactions. In order to overcome this issue, the reactor is designed to ensure a residence time of the particulate materials such that the materials have sufficient to react with the hydrocarbon gas.

In an embodiment of the invention, the feed material has a residence time of from about 4 minutes to about 100 minutes in the reactor. For example, the residence time is between about 4 minutes and 5 minutes, or about 5 minutes and 6 minutes, or about 6 minutes and 7 minutes, or about 7 minutes and 8 minutes, or about 8 minutes and 9 minutes, or about 9 minutes and 10 minutes, or about 10 minutes and 15 minutes, or about 15 minutes and 20 minutes, or about 20 minutes and 25 minutes, or about 25 minutes and 30 minutes, or about 30 minutes and 35 minutes, or about 35 minutes and 40 minutes, or about 40 minutes and 45 minutes, or about 45 minutes and 50 minutes, or about 50 minutes and 55 minutes, or about 55 minutes and 60 minutes, or about 60 minutes and 65 minutes, or about 65 minutes and 70 minutes, or about 70 minutes and 75 minutes, or about 75 minutes and 80 minutes, or about 80 minutes and 85 minutes, or about 85 minutes and 90 minutes, or about 90 minutes and 95 minutes, or about 95 minutes and 100 minutes.

In preferred embodiments of invention, the residence time is about 15 minutes to 45 minutes. In a particularly preferred embodiment of the invention, the residence time of the particulate material is about 15 minutes.

In other embodiments of the invention, the residence time is about 4 minutes.

In some embodiments of the invention, all the particulate material has substantially the same residence time in the reactor.

Feed Material

In an embodiment of the invention, the feed material is selected from the group consisting of carbonaceous particulate materials, metallic lithium, lithium titanate, tin-based alloys, silicon-carbon based materials and silicon-based materials, such as silicon particles coated with carbonaceous material, preferably silicon nano-particles coated with graphite or silicon nano-particles coated with carbon. In some embodiments of the invention, the carbonaceous material is selected from the group consisting of natural graphite, synthetic graphite, exfoliated graphite, amorphous graphite, carbon black, coke, graphene, graphene fibres, graphene nanotubes, coal tar pitch. PVA and carbon-containing polymers.

In an embodiment of the invention, the feed material is silicon, preferably micron-sized silicon, more preferably with a size of 0.4 to 20 microns.

In an embodiment of the invention, the feed material comprises a cathode material. In an embodiment, the cathode material is selected from one or more of the group comprising: LFP (lithium iron phosphate); LFPM (lithium iron phosphate manganese); LNMO (lithium nickel manganese oxide); LMO (lithium manganese oxide); LiNiCoMn (NCM); LiCoO (LCO); NCA (nickel cobalt alumina); LiTiOMn; NMA ($LiNiMnAlO_2$); and LiNbMn. In an embodiment, the cathode material is comprised of a mixture of cathode materials. As will be appreciated by those of skill in the art that other cathode materials may be used as the particulate material in the invention and that such materials are within the scope of the invention.

In some embodiments, the cathode material comprises single crystal nickel based cathode materials, preferably NCM or NCA.

In some embodiments, the cathode material comprises lithium excess disordered rocksalt cathodes (DRX).

In some embodiments, the cathode material comprises a quaternary transition metal oxide layered framework, preferably NCMA ($LiNiCoMAlO_2$).

In some embodiments, the cathode material comprises a sulfur based cathode material, such as, those suitable for use in Li—S batteries.

In some embodiments, the cathode material is a doped cathode material.

In some embodiment, the doped cathode material comprises any one element or a combination of two or more elements from the list comprising: Mg, Co, Al, Ni, Nb, Fe, Mn, Mo, V, Ti, Cr, Al, P, B, Zr, Ru, F, S, Na, Nd, Cu, Bi, Y, Pd, Pt, Ta, Ga, or Si.

In some embodiments of the invention, the feed material comprises silicon particles. Preferably, the silicon particles have a size in the range of about 10 nm to 400 nm, more preferably about 50 nm to 300 nm. For example, the silicon particles have a size of between about 10 nm and about 20 nm, or between about 20 nm and 30 nm, or between about 30 nm and 40 nm, or between about 40 nm and 50 nm, or between about 50 nm and 60 nm, or between about 60 nm and 70 nm, or between about 70 nm and 80 nm, or between about 80 nm and 90 nm, or between about 90 nm and 100 nm, or between about 100 nm and 110 nm, or between about 110 nm and 150 nm, or between about 150 nm and 200 nm, or between about 200 nm and 250 nm, or between about 250 nm and 300 nm, or between about 300 nm and 350 nm, or between about 350 nm and 400 nm. In a particularly preferred embodiment of the invention, the silicon particles have a size of about 100 nm. In some embodiments of the invention, the size refers to the diameter of the particles.

In some embodiments of the invention, the carbonaceous particulate material is selected from the group consisting of natural graphite, synthetic graphite, exfoliated graphite, amorphous graphite, amorphous carbon, carbon black, coke, graphene, graphene fibres and graphene nanotubes. In some embodiments, the carbonaceous particulate material at least substantially encapsulates or surrounds a secondary material. In some embodiments, the secondary material is selected from the group comprising metallic lithium, lithium titanate, tin-based alloys and silicon-based materials, preferably silicon particles, preferably silicon nano-particles.

In an embodiment of the invention, the feed material has a size of between about 0.001 μm to about 1000 μm. For example, the feed material has a size of between about 0.001 μm and about 0.005 μm, or between about 0.005 μm and about 0.01 μm, or between about 0.01 μm and about 0.05 μm, or between about 0.05 μm and about 0.1 μm, or between about 0.1 μm and about 0.2 μm, or between about 0.2 μm and about 0.3 μm, or between about 0.3 μm and about 0.4 μm, or between about 0.4 μm and about 0.5 μm, or between about 0.5 μm and about 0.6 μm, or between about 0.6 μm and about 0.7 μm, or between about 0.7 μm and about 0.8 μm, or between about 0.8 μm and about 0.9 μm, or between about 0.9 μm and about 1 μm, or between about 1 μm and about 5 μm, or between about 5 μm and about 10 μm, or between about 10 μm and about 15 μm, or between about 15 μm and about 20 μm, or between about 20 μm and about 25 μm, or between about 25 μm and about 30 μm, or between about 30 μm and about 35 μm, or between about 35 μm and about 40 μm, or between about 40 μm and about 45 μm, or between about 45 μm and about 50 μm, or between about 50 μm and about 55 μm, or between about 55 μm and about 60 μm, or between about 60 μm and about 65 μm, or between about 65 μm and about 70 μm, or between about 70 μm and about 75 μm, or between about 75 μm and about 80 μm, or between about 80 μm and about 85 μm, or between about 85 μm and about 90 μm, or between about 90 μm and about 95 μm, or between about 95 μm and about 100 μm, or between about 100 μm and about 150 μm, or between about 150 μm and about 200 μm, or between about 200 μm and about 250 μm, or between about 250 μm and about 300 μm, or between about 300 μm and about 350 μm, or between about 350 μm and about 400 μm, or between about 400 μm and about 450 μm, or between about 450 μm and about 500 μm, or between about 500 μm and about 550 μm, or between about 550 μm and about 600 μm, or between about 600 μm and about 650 μm, or between about 650 μm and about 700 μm, or between about 700 μm and about 750 μm, or between about 750 μm and about 800 μm, or between about 800 μm and about 850 μm, or between about 850 μm and about 900 μm, or between about 900 μm and about 950 μm, or between about 950 μm and about 1000 μm.

In another embodiment of the invention, the feed material has a particle size distribution D50 of about 5 μm to 25 μm. For example, the particle size distribution D50 is 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm or 25 μm.

Reactor

In some embodiments of the invention, the reactor further comprises n bends, each bend having an $n+1^{th}$ inlet conduit and an $n+1^{th}$ outlet conduit, wherein an $n^{th}$ outlet conduit is in fluid communication with and defines an $n+1^{th}$ inlet conduit. In a specific embodiment of the invention, the reactor further comprises a second bend having a second inlet conduit and a second outlet conduit, wherein the first outlet conduit is in fluid communication with and defines the second inlet conduit.

For example, the reactor may comprise 1, 2, 3, 4, 5, 6, 7, 8, 9, 10, 11, 12, 13, 14, 15, 16, 17, 18, 19 or 20 bends, having 1, 2, 3, 4, 5, 6, 7, 8, 9, 10, 11, 12, 13, 14, 15, 16, 17, 18, 19 or 20 inlet conduits and outlet conduits, wherein the $1^{st}$, $2^{nd}$, $3^{rd}$, $4^{th}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, or $19^{th}$ outlet conduit is in fluid communication with and defines the $2^{nd}$, $3^{rd}$, $4^{th}$, $5^{th}$, $6^{th}$, $7^{th}$, $8^{th}$, $9^{th}$, $10^{th}$, $11^{th}$, $12^{th}$, $13^{th}$, $14^{th}$, $15^{th}$, $16^{th}$, $17^{th}$, $18^{th}$, $19^{th}$ or $20^{th}$, respectively. In other embodiments of the invention, the reactor comprises more than 20 bends.

The skilled person would appreciate that the reactor comprises a serpentine, sinusoidal or "wave-pattern" pathway for the particulate material to flow through while in contact with the hydrocarbon gas. Advantageously, this increases the residence time of the particulate material in the reactor, such that the particulate material has sufficient time to react with the hydrocarbon gas, leading to complete surface modification.

In some embodiments, the bend is angled at between about 0° and about 180°, or between about 30° and about 150°, or between about 60° and about 120°. For example, the bend is angled at between about 0° and about 10°, between about 10° and about 20°, between about 20° and about 30°, between about 30° and about 40°, between about 40° and about 50°, between about 50° and about 60°, between about 60° and about 70°, between about 70° and about 80°, between about 80° and about 90°, between about 90° and about 100°, between about 100° and about 110°, between about 110° and about 120°, between about 120° and about 130°, between about 130° and about 140°, between about 140° and about 150°, between about 150° and about 160°, between about 160° and about 170°, or between about 170° and about 180°. The bend may be angled at about 5, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, or 180°

In preferred embodiments, wherein the bend is angled at about 45°, about 90° or about 135°.

In an embodiment of the invention, the bend is semi-circular.

In an embodiment of the invention, each respective conduit is circular in cross section. In some embodiments of the invention, each respective conduit is of the same cross-sectional area. In some embodiments of the invention, each respective conduit is of different cross-sectional area. Preferably, conduit diameters can vary to maintain constant entrainment velocity along the pathway of the reactor with increasing gas flows. In particular embodiments, the conduit diameter is increasing from the conduit inlet to the conduit outlet.

In some embodiments, the inlet and/or outlet conduit is fitted with cleaning ports. Advantageously, the cleaning ports may provide periodic "bumping" with extra inert, for example argon gas, to move any accumulated large particles forward.

In some embodiments of the invention, the total length of the conduit is between about 10 m to about 300 m. For example, the length is between about 10 m and about 20 m, or about 20 m and about 30 m, or about 30 m and about 40 m, or about 40 m and about 50 m, or about 50 m and about 60 m, or about 60 m and about 70 m, or about 70 m and about 80 m, or about 80 m and about 90 m, or about 90 m and about 100 m, or about 100 m and about 120 m, or about 120 m and about 140 m, or about 140 m and about 160 m, or about 160 m and about 180 m, or about 180 m and about 200 m, or about 200 m and about 220 m, or about 220 m and about 240 m, or about 240 m and about 260 m, or about 260 m and about 280 m, or about 280 m and about 300 m. In one embodiment of the invention, the total length of the conduits is about 36 m. In another embodiment, the total length is about 180 m.

Inert Gas

The skilled person would understand that the use of a flowing inert gas avoids the oxidation of the feed material, especially the carbonaceous particulate materials.

In an embodiment of the invention, the inert gas is helium, nitrogen, argon or neon, or a combination thereof. In a preferred embodiment of the invention, the inert gas is argon.

In an embodiment of the invention, the inert gas is introduced into the reactor at multiple points along the inlet and/or outlet conduits. Preferably, each point can operate independently of one another in terms of flow rate and/or pressure and/or type of inert gas.

In an embodiment of the invention, the hydrocarbon gas is introduced into the reactor at multiple points along the inlet and/or outlet conduits. Preferably, each point can operate independently of one another in terms of flow rate and/or pressure and/or type of hydrocarbon gas.

In an embodiment of the invention, the hydrocarbon gas and inert gas are introduced into the reactor at multiple points along the inlet and/or outlet conduits. In an embodiment, the inert gas provides a constant flow of gas along the reactor and the hydrocarbon gas is inserted at multiple points along the inlet and/or outlet conduits.

In some embodiments, the reactor comprises one or more inert gas inlets along the inlet and/or outlet conduits for introducing the inert gas into the reactor, preferably two or more inert gas inlets. For example, the reactor may comprise 1, 2, 3, 4, 5, 6, 7, 8, 9, 10, 11, 12, 13, 14, 15, 16, 17, 18, 19 or 20 inert gas inlets.

In an embodiment, the hydrocarbon gas or carrier gas could be pre-heated to a temperature within at least about 1-50% of the temperature inside the reactor, preferably 1, 2, 3, 4, 5, 6, 7, 8, 9, 10, 15, 20, 25, 30, 35, 40, or 45%.

Temperature and Pressure

The skilled person would appreciate that the reaction temperature and/or pressure depends on the specific feed material and/or hydrocarbon gas.

The feed material is in contact with the hydrocarbon gas at a temperature of from about 500° C. to about 1500° C. For example, the temperature is between about 500° C. and about 550° C., or between about 550° C. and about 600° C., or between about 600° C. and about 650° C., or between about 650° C. and about 700° C., or between about 700° C. and about 750° C., or between about 750° C. and about 800° C., or between about 800° C. and about 850° C., or between about 850° C. and about 900° C., or between about 900° C. and about 950° C., or between about 950° C. and about 1000° C., or between about 1000° C. and about 1050° C., or between about 1050° C. and about 1100° C., or between about 1100° C. and about 1150° C., or between about 1150° C. and about 1200° C., or between about 1200° C. and about 1250° C., or between about 1250° C. and about 1300° C., or between about 1300° C. and about 1350° C., or between about 1350° C. and about 1400° C., or between about 1400° C. and about 1450° C., or between about 1450° C. and about 1500° C.

In an embodiment of the invention, the feed material is in contact with the hydrocarbon gas at a temperature of from about 600° C. to about 1200° C. In a preferred embodiment of the invention, the feed material is in contact with the hydrocarbon gas at a temperature of about 1000° C.

In an embodiment of the invention, the feed material is in contact with the hydrocarbon gas at a pressure of from about 25 kPag to about 75 kPag. For example, the pressure is between about 25 kPag and about 30 kPag, or between about 30 kPag and about 35 kPag, or between about 35 kPag and about 40 kPag, or between about 40 kPag and about 45 kPag, or between about 45 kPag and about 50 kPag, or between about 50 kPag and about 55 kPag, or between about 55 kPag and about 60 kPag, or between about 60 kPag and about 65 kPag, or between about 65 kPag and about 70 kPag, or between about 70 kPag and about 75 kPag. In a preferred embodiment of the invention, the feed material is in contact with the hydrocarbon gas at a pressure of 50 kPag.

Hydrocarbon Gas

Preferably, the surface modification of the feed material is achieved by contacting the material to be modified with a hydrocarbon gas.

In one embodiment of the invention, the hydrocarbon gas is an aliphatic or aromatic hydrocarbon, and may optionally contain one or more nitrogen atoms, selected from the group consisting of methane, ethane, ethylene, propane, propene, acetylene, butane, methylamine, dimethylamine, trimethylamine, ethylamine, diethylamine, triethylamine acetonitrile, pyrrole, quinoline, isoquinoline, acridine, pyrazine, quinoxaline, imidazole, benzimidazole, purine, pyrazole, indazole, pyrimidine quinazoline, pyrimidine, quinazoline, pyridazine, cinnoline, pyridine, dimethylformamide (DMF), nitromethane, benzene, toluene, xylene and combinations thereof, preferably methane or short-chain hydrocarbons. In one embodiment, the hydrocarbon gas is natural gas or sourced from biogas.

In a specific embodiment of the invention, the hydrocarbon gas is propane.

In some embodiments, the hydrocarbon gas further comprises a secondary gas.

In some embodiments, the secondary gas is a nitrogen containing gas, preferably acetonitrile or pyrrole.

In some embodiments, the hydrocarbon gas further comprises a dopant, preferably the dopant is nitrogen or alumina.

In an embodiment of the invention, the hydrocarbon gas is introduced into the reactor at multiple points along the inlet and/or outlet conduits. Preferably, each point can operate independently of one another in terms of flow rate and/or pressure and/or type of hydrocarbon gas. In an embodiment of the invention, the reactor gases are analysed in conjunction at multiple points to allow determination of the steady-state equilibrium and control of the reactive gas input rate and/or location along the pathway with respect to residence time.

Advantageously, introducing hydrocarbon gas into the reactor at multiple points along the inlet and/or outlet conduits provides flexibility in controlling particle residence time, reaction rate and/or product uniformity. In this way, the reactor and/or the process may be designed such that all the particles have a similar residence time in the reactor and uniform reaction happens to all the particles.

In some embodiments, the hydrocarbon gas is introduced into the reactor at multiple points along the inlet and/or outlet conduits through a number of "cold" nozzle (external to the heating means). Advantageously this lowers the risk of blockage from carbon deposition.

In some embodiments, the reactor comprises sample means to sample progressively intermediated off-gas streams to confirm reaction extent.

Fluidisation

In an embodiment of the invention, the reactor comprises a feed control system for feeding the feed material to the reactor.

In some embodiments of the invention, the feed control system comprises a compartment where the feed material is fluidised and introduced into the reactor by a supply of carrier gas.

When a gas flow is introduced through the bottom of a bed of solid particles, it will move upwards through the bed via the empty spaces between the particles. At low gas velocities, aerodynamic drag on each particle is also low, and thus the bed remains in a fixed state. Increasing the velocity, the aerodynamic drag forces will begin to counteract the gravitational forces, causing the bed to expand in volume as the particles move away from each other. Further increasing the velocity, it will reach a critical value at which the upward drag forces will exactly equal the downward gravitational forces, causing the particles to become suspended within the fluid. At this critical value, the bed is said to be fluidised and will exhibit fluidic behavior. By further increasing gas velocity, the bulk density of the bed will continue to decrease, and its fluidisation becomes more intense until the particles no longer form a bed and are "conveyed" upwards by the gas flow.

In some embodiments of the invention, the carrier gas is the inert gas as described above. In some embodiments of the invention, the carrier gas comprises helium, nitrogen, argon or neon, or a combination thereof. In one embodiment, the carrier gas further comprises about 1% to 10% v/v hydrogen, preferably as a reductant, for example, 1%, 2%, 3%, 4%, 5%, 6%, 7%, 8%, 9% or 10% v/v. Preferably, the carrier gas further comprises 5% v/v hydrogen.

In some embodiments of the invention, the carrier gas has a flow rate of between about 0.01 $sm^3/h$ and 0.1 $sm^3/h$, for example 0.01 $sm^3/h$, 0.02 $sm^3/h$, 0.03 $sm^3/h$, 0.04 $sm^3/h$, 0.05 $sm^3/h$, 0.06 $sm^3/h$, 0.07 $sm^3/h$, 0.08 $sm^3/h$, 0.09 $sm^3/h$, or 0.1 $sm^3/h$. In one embodiment of the invention, the carrier gas has a flow rate of about 0.04 $sm^3/h$. In another embodiment of the invention, the carrier gas has flow rate of about 0.05 $sm^3/h$. In other embodiments, the flow rate of the carrier gas is high than 0.1 $sm^3/h$. The skilled person would understand that the flow rate of the carrier gas is dependent on a number of factors including flow rate of the feed material, diameter of conduits and conduit length.

In an embodiment of the invention, the fluidised feed material flow is characterised as a turbulent flow. Advantageously, this leads to the tumbling of the feed materials in the reactor and a surface modification with even coating or deposition. In other embodiments of the invention, the fluidised feed material flow is characterised as a laminar flow.

In an embodiment of the invention, the carrier gas is introduced into the reactor at multiple points along the inlet and/or outlet conduits. Preferably, each point can operate independently of one another in terms of flow rate and/or pressure and/or type of carrier gas. Advantageously, this maintains the feed material in a fluidised state and the carrier gas pressure and/or flow rate can be varied as the weight of the particles increase as they progress through the reactor. Additionally it should be recognised that the reactor pipe diameter can be adjusted by design to maintain relatively constant fluidisation velocity with increasing gas input along the path of the reactor.

In some embodiments of the invention, the carrier gas could be preheated. In preferred embodiments of the invention, the carrier gas is preheated by receiving heat from the particulate material and spent carrier gases in a heat exchanger, for example a pipe-in-pipe heat exchanger. Advantageously, this increases the temperature of the fluidised feed material flow and reduces the heat required for reaction, thereby increasing the energy efficiency of the process.

In an embodiment of the invention, the feed material is fed in batches. Preferably, the feed material is fed in batches using lock hopper (single, double, and/or others). The skilled person would understand that a lock hopper provides a means of both allowing operation of many feeding devices that have only a low-pressure capability, to operate at very much higher pressures, and allowing continuous conveying from a single blow-tank feeder. The lock hopper is located between the supply hopper, which will generally be at atmospheric pressure to allow continuous loading of material, and the material feeding device, which can be at any pressure required, almost without limit.

In other embodiments of the invention, the feed material is fed continuously. In other embodiments of the invention, the feed material is fed in batches. In some embodiments, the feed material is fed in batches at different locations in the conduit. In other embodiments of the invention, the feed material is fed continuously at different locations in the conduit.

In some embodiments, the feed control system comprises an agitated screw feeder.

In some embodiments of the invention, the feed material is fed at a rate of from about 0.1 kg/h to about 10 kg/h, for example 2 kg/h, 3 kg/h, 4 kg/h, 5 kg/h, 6 kg/h, 7 kg/h, 8 kg/h, 9 kg/h, or 10 kg/h. In a particular embodiment of the invention, the feed material is fed at about 5 kg/h. In other embodiments, the feed material is fed at a rate of above 10 kg/h. For example, the rate may be 20 kg/h, 50 kg/h, 100 kg/h, 200 kg/h, 300 kg/h, 400 kg/h, 500 kg/h, 600 kg/h, 700 kg/h, 800 kg/h, 900 kg/h, 1000 kg/h, 2000 kg/h, 3000 kg/h, 4000 kg/h, 5000 kg/h, 6000 kg/h, 7000 kg/h, 8000 kg/h, 9000 kg/h, 10000 kg/h, In some embodiments of the invention, the feed material has a volume fraction in the fluidised feed material flow of between about 1% to about 10%, for example, 1%, 2%, 3%, 4%, 5%, 6%, 7%, 8%, 9%, or 10%. In one embodiment of the invention, the volume fraction is about 2%.

In some embodiments of the invention, the feed material has a Geldart Classification of A or C.

In some embodiments of the invention, the fluidised feed material has a solid flux of between about 1 $kg/m^2s$ and 10 $kg/m^2s$, for example 1 $kg/m^2s$, 2 $kg/m^2s$, 3 $kg/m^2s$, 4 $kg/m^2s$, 5 $kg/m^2s$, 6 $kg/m^2s$, 7 $kg/m^2s$, 8 $kg/m^2s$, 9 $kg/m^2s$, 10 $kg/m^2s$. In one embodiment of the invention, the solid flux is about 7 $kg/m^2s$.

In some embodiment of the invention, the fluidised feed material has a velocity between about 0.1 m/s and 1 m/s in the reactor. For example, the velocity is between about 0.1 m/s and 0.2 m/s, or between about 0.2 m/s and 0.3 m/s, or between about 0.3 m/s and 0.4 m/s, or between about 0.4 m/s and 0.5 m/s, or between about 0.5 m/s and 0.6 m/s, or between about 0.6 m/s and 0.7 m/s, or between about 0.7 m/s and 0.8 m/s, or between about 0.8 m/s and 0.9 m/s, or between about 0.9 m/s and 1 m/s. In one embodiment of the invention, the fluidised feed material has a velocity of about 0.15 m/s. In another embodiment of the invention, the velocity is about 0.2 m/s.

Heating Means

In preferred embodiments of the invention, the reactor further comprises heating means to heat the reactor.

In one embodiment of the invention, the heating means comprises a burner for burning a mixture of a gases fuel, for example natural gas or liquid petroleum gas, and air, preferably low-pressure air.

In another embodiment of the invention, the heating means comprises an oven or heating element, for example an electrical resistance.

In other embodiments of the invention, the heating means comprises an electrically heated furnace. In a particular embodiment of the invention, the reactor is placed inside a split electrically heated muffle furnace.

Separation Means

In an embodiment of the invention, the reactor further comprises separation means in fluid communication with the outlet conduit for separating the particulate material from gas. The skilled person would understand that the feed material flow, for example fluidised feed material flow at the end of the outlet conduit could comprise a mixture of particulate material and/or hydrocarbon gas and carrier gas. After the separation, the particulate may be collected and stored in storage units, for example, metal drums.

Advantageously, there is no intermediate hot gas-solids separation stages in the reactor, other than at the outlet conduit once the mixture is cooled down.

In a preferred embodiment of the invention, the separation means comprises a sintered metal filter. The skilled person would understand that sintered metal filters are used for hot gas filtration. These filters can provide high efficiency particulate capture. In one embodiment of the invention, the capture efficiency is up to 90%. In other embodiments of the invention, the capture efficiency is between about 90% and about 99.99%. In a particularly preferred embodiment of the invention, the capture efficiency is about 99.9%.

In some embodiments, the separation means comprises a cyclone with a separation efficiency of 80 to 99.99%.

In other embodiments, the separation means comprises a bag filter with a separation efficiency of 80 to 99.99%. The bag filter could be made of PTFE, sintered metal, or other components.

In an embodiment of the invention, the sintered metal filter is insulated. The sintered metal filter may require insulation when dew point issues arise. The skilled person would appreciate that dew point is the temperature at which a component in a mixed gas begins to condense. For example, when the feed material flow, for example fluidised feed material flow, at the outlet is mixed with a cool gas during the filtration process, the hydrocarbon gas may condense at a specific pressure and/or temperature depending on the composition and/or type of the hydrocarbon gas. This invariably introduces difficulty in the gas-solid particle separation in the sintered metal filter and needs to be avoided.

In an embodiment of the invention, the separation means comprises a plurality of sintered metal filters connected in series, or parallel, or arranged in series parallel combination.

In an embodiment of the invention, the separation means comprise a back-pulse, fast acting valves to prevent blockage of the filtration membrane pores.

In a preferred embodiment of the invention, the separated gas is recycled back to the reactor. Advantageously, this saves material cost and increases utility efficiency of the reactor. In an embodiment, prior to recycling the separated gas into the reactor, the separated gas is compressed.

According to a second aspect of the present invention there is provided a method of preparing a particulate material, comprising the step of flowing a feed material through a CVD reactor comprising a first inlet conduit; and a first bend having one end located at the end of the first inlet conduit, and another end located at the start of a first outlet conduit, wherein the particulate flows through the inlet conduit and the outlet conduit while in contact with a hydrocarbon gas under a flowing inert gas at a temperature of between about 500° C. to about 1500° C.

In an embodiment, the CVD reactor is an entrained flow reactor.

In an embodiment of the invention, the method further comprises the step of recycling at least a portion of the particulate material back to the reactor.

In an embodiment of the invention, the particulate material is a surface-modified particulate material including graphite, mircon or nano sized silicon and silicon-carbon composite.

According to a third aspect of the present invention there is provided particulate material obtained or obtainable from a method according the second aspect of the present invention.

In an embodiment of the invention, the particulate material is a surface-modified particulate material.

In an embodiment of the invention, the particulate material is silicon particles coated with at least one layer of carbonaceous material, preferably silicon nano-particles coated with graphite or silicon nano-particles coated with carbon. For example, the silicon particles are coated with 1, 2, 3, 4, or 5 layers of carbonaceous material.

In an embodiment of the invention, the silicon particles are coated with one layer of carbonaceous material. The layer has a thickness of about 0.1 nm to about 100 nm, preferably about 5 nm to about 30 nm, more preferably about 5 nm to about 20 nm. For example, the layer has a thickness of about 0.1 nm to about 0.2 nm, or about 0.2 nm to about 0.3 nm, or about 0.3 nm to about 0.4 nm, or about 0.4 nm to about 0.5 nm, or about 0.5 nm to about 0.6 nm, or about 0.6 nm to about 0.7 nm, or about 0.7 nm to about 0.8 nm, or about 0.8 nm to about 0.9 nm, or about 0.9 nm to about 1 nm, or about 1 nm to about 10 nm, or about 10 nm to about 20 nm, or about 20 nm to about 30 nm, or about 30 nm to about 40 nm, or about 40 nm to about 50 nm, or about 50 nm to about 60 nm, or about 60 nm to about 70 nm, or about 70 nm to about 80 nm, or about 80 nm to about 90 nm, or about 90 nm to about 100 nm. In other embodiments of the invention, the layer has a thickness of about 0.025% to about 1000% of the particle size, preferably about 1.25% to about 300%, more preferably about 1.25% to about 200%. For example, the thickness is about 0.025% to about 0.1%, or about 0.1% to about 1%, or about 1% to about 10%, or about 10% to about 100%, or about 100% to about 200%, or about 200% to about 300%, or about 300% to about 400%, or about 400% to about 500%, or about 500% to about 600%, or about 600% to about 700%, or about 700% to about 800%, or about 800% to about 900%, or about 900% to about 1000%.

In an embodiment of the invention, the silicon particles are coated with two layers of carbonaceous material. The layers have a thickness of about 0.1 nm to about 400 nm, preferably about 100 nm to about 300 nm, more preferably about 100 nm to about 250 nm, particularly preferably about 100 nm to about 200 nm. For example, the layer has a thickness of about 0.1 nm to about 0.2 nm, or about 0.2 nm to about 0.3 nm, or about 0.3 nm to about 0.4 nm, or about 0.4 nm to about 0.5 nm, or about 0.5 nm to about 0.6 nm, or about 0.6 nm to about 0.7 nm, or about 0.7 nm to about 0.8 nm, or about 0.8 nm to about 0.9 nm, or about 0.9 nm to about 1 nm, or about 1 nm to about 10 nm, or about 10 nm to about 20 nm, or about 20 nm to about 30 nm, or about 30 nm to about 40 nm, or about 40 nm to about 50 nm, or about 50 nm to about 60 nm, or about 60 nm to about 70 nm, or about 70 nm to about 80 nm, or about 80 nm to about 90 nm, or about 90 nm to about 100 nm, or about 100 nm to about 200 nm, or about 200 nm to about 300 nm, or about 300 nm to about 400 nm. In other embodiments of the invention, the layers have a thickness of about 0.025% to about 4000% of the particle size, preferably about 25% to about 3000%, more preferably about 25% to about 2500%, particularly preferably about 25% to about 2000%. For example, the thickness is about 0.025% to about 0.1%, or about 0.1% to about 1%, or about 1% to about 10%, or about 10% to about 100%, or about 100% to about 200%, or about 200% to about 300%, or about 300% to about 400%, or about 400% to about 500%, or about 500% to about 600%, or about 600% to about 700%, or about 700% to about 800%, or about 800% to about 900%, or about 900% to about 1000%, or about 1000% to about 2000%, or about 2000% to about 3000%, or about 3000% to about 4000%.

In an embodiment of the invention, the coated silicon particles comprise about 3% to about 20% of carbonaceous material, preferably about 5% to 15%, more preferably about 5% to 10%. For example, the silicon particles are coated with 3%, 4%, 5%, 6%, 7%, 8%, 9%, 10%, 11%, 12%, 13%, 14%, 15%, 16%, 17%, 18%, 19%, or 20% carbonaceous material, preferably graphite, amorphous carbon and/or a mixture thereof.

In preferred embodiments of the invention, the coated silicon particles are in the form of clusters and/or agglomerates. Advantageously, the clusters and/or agglomerates of coated silicon particles are easier to ship, handle and/or manage.

In some embodiments of the invention, the clusters and/or agglomerates of coated silicon particles have at least one of the following properties:

$D_{10}$ size distribution of about 1 μm to about 10 μm;
$D_{50}$ size distribution of about 5 μm to about 150 μm;
$D_{90}$ size distribution of about 10 μm to about 200 μm; and
$D_{max}$ size distribution of about 30 μm to about 300 μm.

In a preferred embodiment of the invention, the clusters and/or agglomerates have a $D_{50}$ size distribution of about 100 nm. In other preferred embodiments of the invention, the clusters and/or agglomerates have a $D_{10}$ size distribution of about 5 μm, a $D_{50}$ size distribution of about 10 μm to about 12 μm, a $D_{90}$ size distribution of 25 μm, and/or a $D_{max}$ size distribution of about 40 μm. In another preferred embodiment of the invention, the clusters and/or agglomerates have a $D_{max}$ size distribution of less than about 40 μm.

According to a fourth aspect of the present invention there is provided use of a particulate material according to the third aspect of the present invention for preparing an electrode material.

According to a fifth aspect of the present invention there is provided an electrode material comprising a particulate material according to the third aspect of the present invention.

According to a sixth aspect of the present invention there is provided use of an electrode material according to the fifth aspect of the present invention for preparing an electrode of an alkali metal-ion battery.

According to a seventh aspect of the present invention there is provided an electrode of an alkali metal-ion battery, the electrode comprising an electrode material according to the fifth aspect of the present invention.

According to an eighth aspect of the present invention there is provided use of an electrode according to the seventh aspect of the present invention for preparing an alkali metal-ion battery.

According to a ninth aspect of the present invention there is provided an alkali metal-ion battery comprising an electrode according to the seventh aspect of the present invention.

According to a tenth aspect of the present invention there is provided a use according to the sixth or eighth aspect of the present invention, the electrode according to the seventh aspect of the present invention, or the battery according to the ninth aspect of the present invention, wherein the alkali metal-ion battery is a lithium-ion battery, a sodium-ion battery, or a potassium-ion battery.

In an embodiment of the invention, the particulate material is a surface-modified particulate material.

Process Control System

In preferred embodiments of invention, the reactor comprises at least one process control system. Examples of the system include, but are not limited to a process control system that controls the flow rate of the mixture of liquefied petroleum gas and air in the burner, based on a predetermined reaction temperature and the measurement of at least one temperature transducer located along the inlet and/or outlet conduits. Preferably, the process control system employs a feedback control algorithm. For example, the algorithm can be proportional integral derivative control or model predicative control.

Other aspects of the present invention will become apparent to those ordinarily skilled in the art upon review of the following description of specific embodiments of the invention.

Definitions

In describing and claiming the present invention, the following terminology will be used in accordance with the definitions set out below. It is also to be understood that the terminology used herein is for the purpose of describing particular embodiments of the invention only and is not intended to be limiting. Unless defined otherwise, all technical and scientific terms used herein have the same meaning as commonly understood by one having ordinary skill in the art to which the invention pertains.

Unless the context clearly requires otherwise, throughout the description and the claims, the words “comprise”, “comprising”, and the like are to be construed in an inclusive sense as opposed to an exclusive or exhaustive sense; that is to say, in the sense of “including, but not limited to”.

As used herein, the phrase “consisting of” excludes any element, step, or ingredient not specified in the claim. When the phrase “consists of” (or variations thereof) appears in a clause of the body of a claim, rather than immediately following the preamble, it limits only the element set forth in that clause; other elements are not excluded from the claim as a whole. As used herein, the phrase “consisting essentially of” limits the scope of a claim to the specified elements or method steps, plus those that do not materially affect the basis and novel characteristic(s) of the claimed subject matter.

With respect to the terms “comprising”, “consisting of”, and “consisting essentially of”, where one of these three terms is used herein, the presently disclosed and claimed subject matter may include the use of either of the other two terms. Thus, in some embodiments not otherwise explicitly recited, any instance of “comprising” may be replaced by “consisting of” or, alternatively, by “consisting essentially of”.

Other than in the operating examples, or where otherwise indicated, all numbers expressing quantities of ingredients or reaction conditions used herein are to be understood as modified in all instances by the term “about”. The examples are not intended to limit the scope of the invention. In what follows, or where otherwise indicated, “%” will mean “weight %”, “ratio” will mean “weight ratio” and “parts” will mean “weight parts”.

The term ‘substantially’ as used herein shall mean comprising more than 50% by weight, where relevant, unless otherwise indicated.

The recitation of a numerical range using endpoints includes all numbers subsumed within that range (e.g., 1 to 5 includes 1, 1.5, 2, 2.75, 3, 3.80, 4, 5, etc.).

Further, unless expressly stated to the contrary, “or” refers to an inclusive or and not to an exclusive or. For example, a condition A or B is satisfied by any one of the following: A is true (or present) and B is false (or not present), A is false (or not present) and B is true (or present), and both A and B are true (or present).

The terms “preferred” and “preferably” refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

It must also be noted that, as used in the specification and the appended claims, the singular forms “a”, “an” and “the” include plural referents unless the context clearly dictates otherwise.

As used herein, with reference to numbers in a range of numerals, the terms “about,” “approximately” and “substantially” are understood to refer to the range of −10% to +10% of the referenced number, preferably −5% to +5% of the referenced number, more preferably −1% to +1% of the referenced number, most preferably −0.1% to +0.1% of the referenced number. Moreover, with reference to numerical ranges, these terms should be construed as providing support for a claim directed to any number or subset of numbers in that range. For example, a disclosure of from 1 to 10 should be construed as supporting a range of from 1 to 8, from 3 to 7, from 1 to 9, from 3.6 to 4.6, from 3.5 to 9.9, from 8 to 10, and so forth.

The term “short-chain hydrocarbons” refers to hydrocarbons with less than or equal to four carbon atoms.

The term “turbulent flow” refers to a flow that is characterised by the irregular movement of particles in a fluid and/or by chaotic changes in pressure and flow velocity. The Reynolds Number of a turbulent flow is typically greater than or equal to 2000.

The term “laminar flow” refers to, in contrast to a turbulent flow, a fluid that flows in parallel layers, with no disruption between those layers. The Reynolds Number of a turbulent flow is typically less than 2000.

The term “Geldart Classification” refers to a classification that places materials into four groups based on their behaviours when fluidised as follows: A—aeratable; B—bubbly; C—cohesive; D—spoutable.

In some embodiments, the terms “carrier gas” and “inert gas” are used interchangeably.

Although exemplary embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

BRIEF DESCRIPTION OF THE DRAWINGS

Preferred embodiments of the invention will now be described, by way of examples only, with reference to the accompanying drawings in which.

DETAILED DESCRIPTION OF THE INVENTION

Cathode Materials

Figure 1:
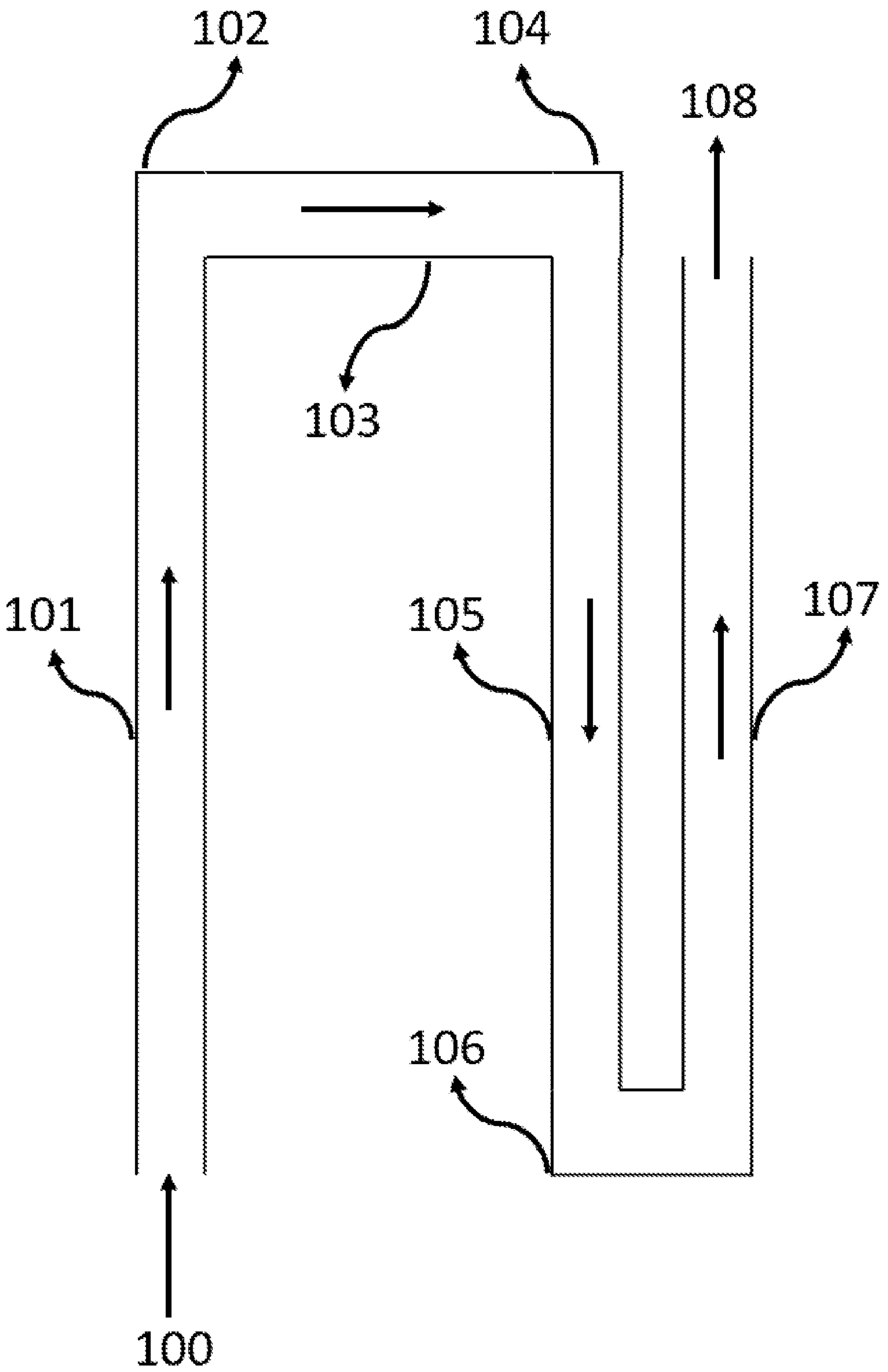
FIG. 1 shows the inlet and outlet conduits of an embodiment of reactor comprising three bends.

Without wishing to be bound by theory, carbon coating of cathode materials not only increase the Li ion and electron transfer but also protect the cathode materials from side reaction at the electrolyte interface. Furthermore, it is understood by those of skill in the art that carbon coating cathode materials, such as LFP, enhance the electrical conductivity, reduces internal resistance of the battery and generally improves the electrochemical performance of the battery.

Without wishing to be bound by theory, to overcome issues of low specific capacity and poor cycling stability in the cathode materials, it has been reported that surface coating is an effective and economical method. Carbon-based materials are a good choice to utilize for coatings, due to their excellent chemical stability and physical properties. Carbon coating aims at offering extra ionic diffusion routes and boosting the transport of electrons through the interface on the cathode surface. Meanwhile, carbon coating could not only control the surface chemical stability of cathode materials and their structure change during lithiation/de-lithiation reaction, but also suppress the adverse reactions between cathode and electrolyte, which caused cycling instability. In addition, carbon coating forms a physical covering layer to diminish the corrosion of electrolytes, which raises the specific capacity, strengthens the thermal stability and prolongs the cycle lifetime of the LIB.

Current limitations of carbon coating of cathode materials are uniformity of coating and fine control over the thickness (and thus wt %) of the carbon coating on the material. The present invention in its preferred embodiments addresses these limitations.

In an embodiment of the invention, the feed material comprises a cathode material. In an embodiment, the cathode material is selected from one or more of the group comprising: LFP (lithium iron phosphate); LFPM (lithium iron phosphate manganese); LNMO (lithium nickel manganese oxide); LMO (lithium manganese oxide); LiNiCoMn (NCM); LiCoO (LCO); NCA (nickel cobalt aluminum oxide); LiTiOMn, NMA ($LiNiMnAlO_2$) and LiNbMn. As will be appreciated by those of skill in the art that other cathode materials may be used as the feed material in the invention and that such materials are within the scope of the invention.

In some embodiments, the cathode material comprises single crystal nickel based cathode materials, preferably NCM or NCA.

In some embodiments, the cathode material comprises lithium excess disordered rocksalt cathodes (DRX).

In some embodiments, the cathode material comprises a quaternary transition metal oxide layered framework, preferably NCMA ($LiNiCoMnAlO_2$).

In some embodiments, the cathode material comprises a sulfur based cathode material, such as, those suitable for use in Li—S batteries.

In some embodiments, the cathode material is a doped cathode material.

In some embodiment, the doped cathode material comprises any one element or a combination of two or more elements from the list comprising: Mg, Co, Al, Ni, Nb, Fe, Mn, Mo, V, Ti, Cr, Al, P, B, Zr, Ru, F, S, Na, Nd, Cu, Bi, Y, Pd, Pt, Ta, Ga, or Si.

EXAMPLE 1

Referring to the embodiment as described in FIG. 1, the reactor comprises three bends 102, 104 and 106. A feed material 100 enters the reactor and passes through the first inlet conduit 101, the first bend 102, the first outlet/second inlet conduit 103, the second bend 104, the second outlet/third inlet conduit 105, the third bend 106 and the third outlet conduit 107. The feed material is surface-modified by contacting with a hydrocarbon gas under a flowing inert gas (not shown) at a temperature of between about 500° C. to about 1500° C. The surface modified particulate material 108 exists the reactor at the end of the third outlet conduit 107.

EXAMPLE 2

Figure 2:
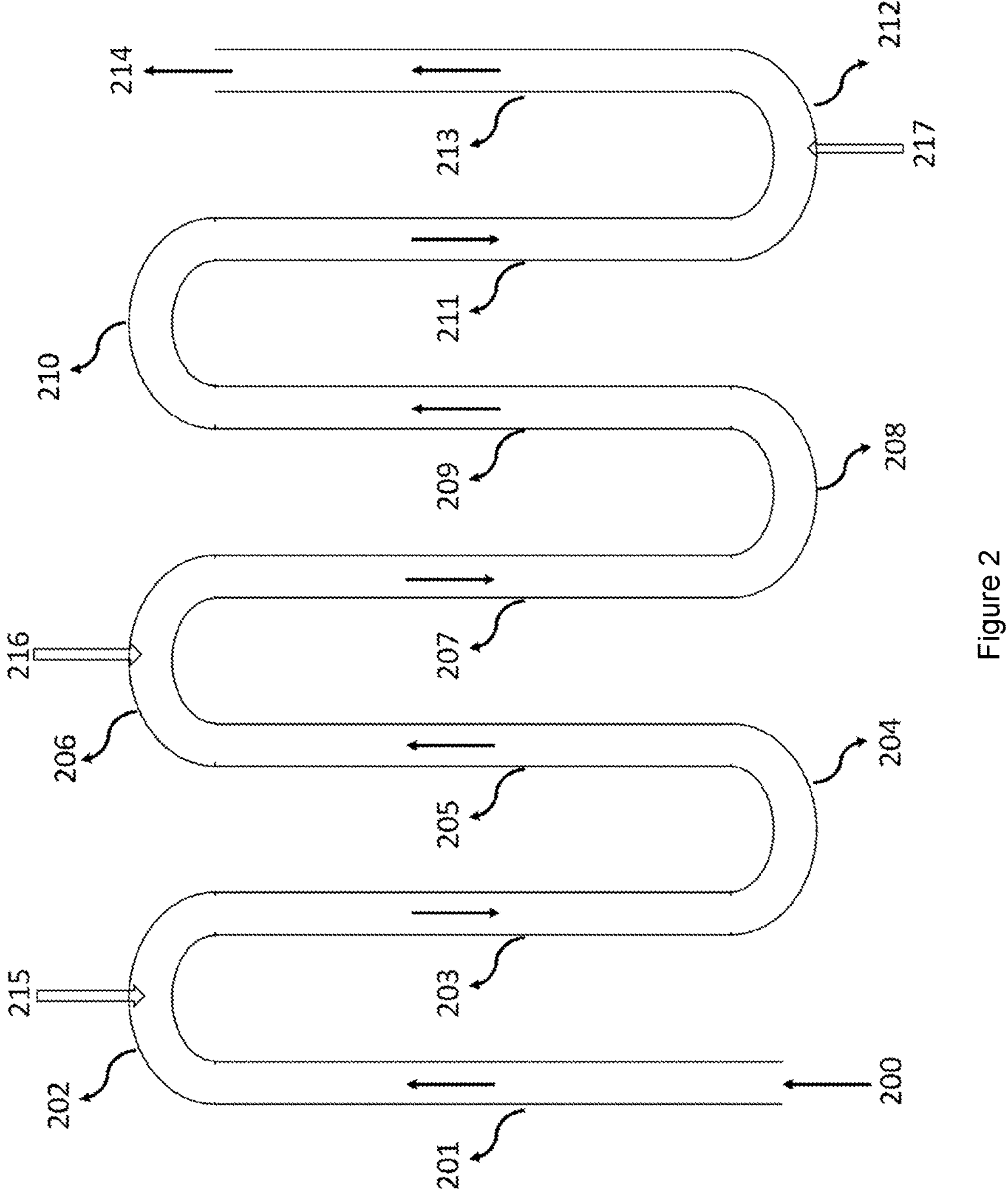
FIG. 2 shows the inlet and outlet conduits of another embodiment of the reactor comprising six semi-circular bends and multiple introduction points for the carrier gas, inert gas and/or hydrocarbon gas.

Referring to the embodiment as described in FIG. 2, the reactor comprises six bends 202, 204, 206, 208, 210 and 212. A feed material 200 fluidised by a carrier gas (not shown) enters the reactor and passes through the first inlet conduit 201, the first bend 202, the first outlet/second inlet conduit 203, the second bend 204, the second outlet/third inlet conduit 205, the third bend 206, the third outlet/fourth inlet conduit 207, the fourth bend 208, the fourth outlet/fifth inlet conduit 209, the fifth bend 210, the fifth outlet/sixth inlet conduit 211, the sixth bend 212 and the sixth outlet conduit 213. The fluidised feed material is surface-modified by contacting with a hydrocarbon gas under a flowing inert gas at a temperature of between about 500° C. to about 1500° C. The hydrocarbon gas and/or the inert gas may be mixed with the feed material 200 in the form of the carrier gas. Alternatively, the hydrocarbon gas and/or inert gas maybe mixed with the carrier gas. In addition, the hydrocarbon gas and/or inert gas and/or carrier gas can also be introduced into the reactor at multiple points along the inlet/outlet conduits. As a non-limiting example, FIG. 2 shows that a hydrocarbon gas 215, an inert gas 216 and a carrier gas 217 are introduced into the reactor.

It should be noted that the feed material 200 may also be fed into the reactor from the top section of the reactor (not shown) instead of the bottom as shown in FIG. 2.

EXAMPLE 3

Figure 3:
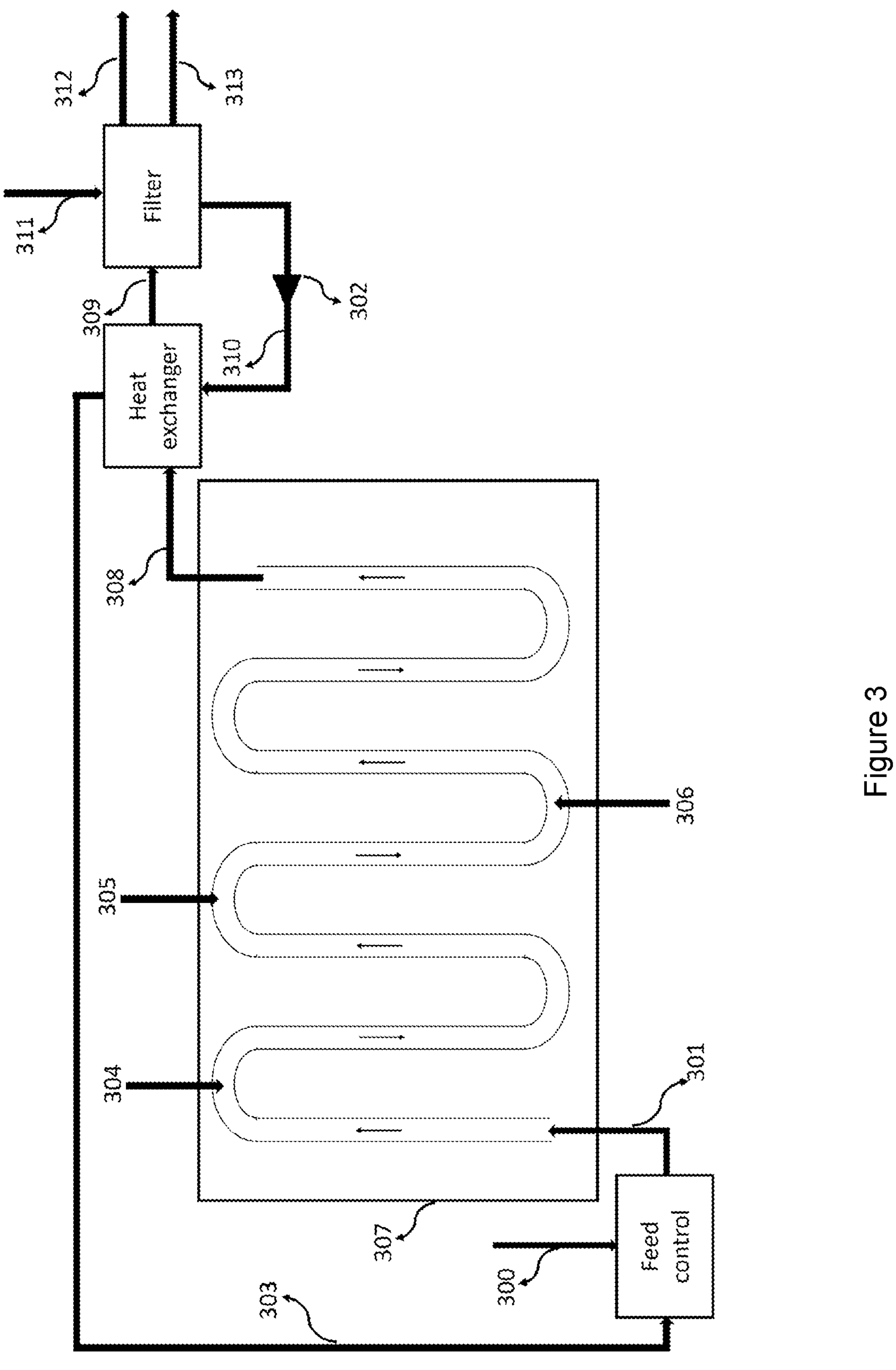
FIG. 3 shows a specific embodiment of the reactor for use in the surface modification of a particulate material.

FIG. 3 describes a reactor and a method of preparing carbon-coated graphite particles using the reactor. Uncoated graphite particles 300 are introduced to feed control system, where they are fluidised by a carrier gas 303 comprising argon and 5% hydrogen. The carrier gas has a flow rate of about 0.05 $sm^3/h$. The carrier gas is preheated in a heat exchanger, where it receives heat from a flow of carbon-coated graphite particles mixed with carrier gas and/or inert gas/and/or unreacted hydrocarbon gas 308. The preheated carrier gas 303 is directed to the feed control system to facilitate the fluidisation of the graphite particles. The graphite particles have a feed rate of about 5 kg/h and a particle density of about 2090 $kg/m^3$ The fluidised uncoated graphite particles 301, having a volume fraction of about 1.7% and a solid flux of about 7 $kg/m^2s$, enter the reactor 307 comprising the inlet/outlet conduits as described in Example 2. Each inlet/outlet conduit has the dimensions outlined in Table 1.

TABLE 1

| Dimensions of inlet/outlet conduits | |
|---|---|
| Diameter (NB) | 15 |
| Schedule (#) | 40 |
| Outer diameter (mm) | 21.34 |
| Wall thickness (mm) | 2.77 |
| Inner diameter (mm) | 15.8 |
| Area ($m^2$) | 0.000196 |
| Length (m) | 6 |

The fluidised graphite particles have a flow rate of about 0.2 m/s in the reactor 307 and a residence time of about 15 minutes. The uncoated particles contact with a hydrocarbon gas propane. Propane can be introduced at the feed control system to be mixed with the carrier gas. In addition, it can be introduced at various points along the inlet/outlet conduits, for example at one or more of introduction points 304, 305 and 306. The skilled person would appreciate that the inert gas and/or carrier gas may also be introduced at various along the inlet/outlet conduits.

The reactor is placed inside a split electrically heated muffle furnace (not shown) and is kept at an operating temperature of about 1000° C. and an operating pressure of about 50 kPag.

The carbon-coated graphite particles mixed with carrier gas and/or inert gas/and/or unreacted hydrocarbon gas 309 are directed to a sintered metal filter. Argon 311 is introduced to the filter to facilitate gas-solid separation. Carbon-coated graphite particles 312 are collected and stored in metal drums, while separated gas 310 is recycled back to the heat exchanger after being compressed by a compressor 302. In some embodiments, the spent carrier gas and/or inert gas 313 is purged, preferably the purged gas is fully combusted within the reactor muffle or in a separate vessel.

Although the invention will be described with reference to specific examples it will be appreciated by those skilled in the art that the invention may be embodied in many other forms.

Other embodiments of the present invention as described herein are defined in the following paragraphs:

1. A CVD reactor, particularly an entrained flow reactor, for preparing a particulate material, the reactor comprising:
   a first inlet conduit; and
   a first bend having one end located at the end of the first inlet conduit, and another end located at the start of a first outlet conduit, wherein the particulate material is prepared by flowing a feed material through the inlet conduit and the outlet conduit while in contact with a hydrocarbon gas under a flowing inert gas at a temperature of between about 500° C. to about 1500° C.
2. The reactor according to paragraph 1, wherein the feed material has a residence time of from about 4 minutes to about 100 minutes in the reactor.
3. The reactor according to any one or more of the preceding paragraphs, wherein the feed material has a residence time of from about 15 minutes to 45 minutes.
4. The reactor according to any one or more of the preceding paragraphs, wherein the feed material is selected from the group consisting of carbonaceous particulate materials, metallic lithium, lithium titanate, tin-based alloys, cathode materials, and silicon-based materials.
5. The reactor according to any one or more of the preceding paragraphs, wherein the silicon-based materials comprise silicon particles, preferably having a size of about 10 nm to about 400 nm.
6. The reactor according to any one or more of the preceding paragraphs, wherein the silicon-based materials comprise silicon particles coated with carbonaceous material, or silicon carbide.
7. The reactor according to any one or more of the preceding paragraphs, wherein the coated silicon particles comprise silicon nano-particles coated with graphite and/or silicon nano-particles coated with carbon, preferably in the form of clusters and agglomerates.
8. The reactor according to any one or more of the preceding paragraphs, wherein the carbonaceous particulate material is selected from the group consisting of natural graphite, synthetic graphite, exfoliated graphite, amorphous graphite, amorphous carbon, carbon black, coke, graphene, graphene fibres and graphene nanotubes.
9. The reactor according to any one or more of the preceding paragraphs, wherein the carbonaceous particulate material at least substantially encapsulates or surrounds a secondary material.
10. The reactor according to any one or more of the preceding paragraphs, wherein the secondary material is selected from the group comprising metallic lithium, lithium titanate, tin-based alloys and silicon-based materials.
11. The reactor according to any one or more of the preceding paragraphs, wherein the secondary material comprises silicon particles or silicon nano-particles.
12. The reactor according to any one or more of the preceding paragraphs, further comprising n bends, each bend having an $n+1^{th}$ inlet conduit and an $n+1^{th}$ outlet conduit, wherein an $n^{th}$ outlet conduit is in fluid communication with and defines an $n+1^{th}$ inlet conduit.
13. The reactor according to any one or more of the preceding paragraphs, further comprising a second bend having a second inlet conduit and a second outlet conduit, wherein the first outlet conduit is in fluid communication with and defines the second inlet conduit.
14. The reactor according to any one or more of the preceding paragraphs, comprising one or more inert gas inlets along the inlet and/or outlet conduits for introducing the inert gas into the reactor, preferably two or more inert gas inlets.
15. The reactor according to any one or more of the preceding paragraphs, wherein the bend is angled at between about 0° and about 180°, or between about 30° and about 150°, or between about 60° and about 120°.
16. The reactor according to any one or more of the preceding paragraphs, wherein the bend is angled at about 45°, about 90° or about 135°.
17. The reactor according to any one or more of the preceding paragraphs, wherein the bend is semi-circular.
18. The reactor according to any one or more of the preceding paragraphs, wherein each respective conduit is circular in cross section.
19. The reactor according to any one or more of the preceding paragraphs, wherein each respective conduit is of the same cross-sectional area.
20. The reactor according to any one or more of the preceding paragraphs, wherein the inert gas is helium, nitrogen, argon or neon, or a combination thereof.
21. The reactor according to any one or more of the preceding paragraphs, wherein the feed material is in contact with the hydrocarbon gas at a temperature of from about 600° C. to about 1200° C.
22. The reactor according to any one or more of the preceding paragraphs, wherein the feed material is in contact with the hydrocarbon gas at a temperature of about 1000° C.
23. The reactor according to any one or more of the preceding paragraphs, wherein the feed material is in contact with the hydrocarbon gas at a pressure of from about 25 kPag to about 75 kPag.

24. The reactor according to any one or more of the preceding paragraphs, wherein the feed material is in contact with the hydrocarbon gas at a pressure of 50 kPag.

25. The reactor according to any one or more of the preceding paragraphs, wherein the hydrocarbon gas is an aliphatic or aromatic hydrocarbon, and may optionally contain one or more nitrogen atoms, selected from the group consisting of methane, ethane, ethylene, propane, propene, acetylene, butane, methylamine, dimethylamine, trimethylamine, ethylamine, diethylamine, triethylamine acetonitrile, pyrrole, quinoline, isoquinoline, acridine, pyrazine, quinoxaline, imidazole, benzimidazole, purine, pyrazole, indazole, pyrimidine quinazoline, pyrimidine, quinazoline, pyridazine, cinnoline, pyridine, dimethylformamide (DMF), nitromethane, benzene, toluene, xylene and combinations thereof, preferably methane or short-chain hydrocarbons.

26. The reactor according to any one of preceding paragraphs, wherein the hydrocarbon gas is propane.

27. The reactor according to any one or more of the preceding paragraphs, further comprising a feed control system for feeding the feed material to the reactor.

28. The reactor according to any one or more of the preceding paragraphs, wherein the feed control system comprises a compartment where the feed material is fluidised and introduced into the reactor by a supply of carrier gas.

29. The reactor according to any one or more of the preceding paragraphs, wherein the carrier gas comprises helium, nitrogen, argon or neon, or a combination thereof.

30. The reactor according to any one or more of the preceding paragraphs, wherein the carrier gas further comprises about 5% v/v hydrogen.

31. The reactor according to any one or more of the preceding paragraphs, wherein the carrier gas is preheated.

32. The reactor according to any one or more of the preceding paragraphs, wherein the carrier gas is preheated by receiving heat from the particulate material and spent carrier gases in a heat exchanger.

33. The reactor according to any one or more of the preceding paragraphs, wherein the heat exchanger is a pipe-in-pipe heat exchanger.

34. The reactor according to any one or more of the preceding paragraphs, wherein the feed material is fed in batches.

35. The reactor according to any one or more of the preceding paragraphs, wherein the feed material is fed in batches using a lock hopper.

36. The reactor according to any one or more of the preceding paragraphs, wherein the feed material is fed continuously.

37. The reactor according to any one or more of the preceding paragraphs, wherein the feed material is fed at a rate of from about 0.1 kg/h to about 10 kg/h.

38. The reactor according to any one or more of the preceding paragraphs, wherein the feed material is fed at about 5 kg/h.

39. The reactor according to any one or more of the preceding paragraphs, further comprising heating means to heat the reactor.

40. The reactor according to any one or more of the preceding paragraphs, wherein the heating means comprises a burner for burning a mixture of a gases fuel and air.

41. The reactor according to any one or more of the preceding paragraphs, wherein the heating means comprises an electrically heated furnace.

42. The reactor according to any one or more of the preceding paragraphs, further comprising separation means in fluid communication with the outlet conduit for separating the particulate material from gas.

43. The reactor according to any one or more of the preceding paragraphs, wherein the separation means comprises a sintered metal filter.

44. The reactor according to any one or more of the preceding paragraphs, wherein the separated gas is recycled back to the reactor.

45. The reactor according to any one or more of the preceding paragraphs, wherein the separated gas is compressed prior to recycling.

46. A method of preparing a particulate material, comprising the step of flowing a feed material through a CVD reactor, particularly an entrained flow reactor, comprising a first inlet conduit; and a first bend having one end located at the end of the first inlet conduit, and another end located at the start of a first outlet conduit, wherein the feed material flows through the inlet conduit and the outlet conduit while in contact with a hydrocarbon gas under a flowing inert gas at a temperature of between about 500° C. to about 1500° C.

47. The method according to any one or more of the preceding paragraphs, wherein the feed material has a residence time of from about 4 minutes to about 100 minutes in the reactor.

48. The method according to any one or more of the preceding paragraphs, wherein the feed material has a residence time of about 15 minutes to 45 minutes.

49. The method according to any one or more of the preceding paragraphs, wherein the feed material is selected from the group consisting of carbonaceous particulate materials, metallic lithium, lithium titanate, tin-based alloys and silicon-based materials.

50. The method according to any one or more of the preceding paragraphs, wherein the silicon-based materials comprise silicon particles, preferably having a size of about 10 nm to about 400 nm.

51. The method according to any one or more of the preceding paragraphs, wherein the silicon-based materials comprise silicon particles coated with carbonaceous material, or silicon carbide.

52. The method according to any one or more of the preceding paragraphs, wherein the coated silicon particles comprise silicon nano-particles coated with graphite and/or silicon nano-particles coated with carbon, preferably in the form of clusters and agglomerates.

53. The method according to any one or more of the preceding paragraphs, wherein the carbonaceous particulate material is selected from the group consisting of natural graphite, synthetic graphite, exfoliated graphite, amorphous carbon, carbon black, coke, graphene, graphene fibres and graphene nanotubes.

54. The method according to any one or more of the preceding paragraphs, wherein the carbonaceous particulate material at least substantially encapsulates or surrounds a secondary material.

55. The method according to any one or more of the preceding paragraphs, wherein the secondary material is selected from the group comprising metallic lithium, lithium titanate, tin-based alloys and silicon-based materials.

56. The method according to any one or more of the preceding paragraphs, wherein the secondary material comprises silicon particles or silicon nano-particles.

57. The method according to any one or more of the preceding paragraphs, wherein the reactor further comprises n bends, each bend having an $n+1^{th}$ inlet conduit and an $n+1^{th}$ outlet conduit, wherein an $n^{th}$ outlet conduit is in fluid communication with and defines an $n+1^{th}$ inlet conduit.

58. The method according to any one or more of the preceding paragraphs, wherein the reactor further comprises a second bend having a second inlet conduit and a second outlet conduit, wherein the first outlet conduit is in fluid communication with and defines the second inlet conduit.

59. The method according to any one or more of the preceding paragraphs, comprising a step of introducing the inert gas into the reactor via one or more inert gas inlets along the inlet and/or outlet conduits, preferably via two or more inert gas inlets.

60. The method according to any one or more of the preceding paragraphs, wherein the bend is angled at between about 0° and about 180°, or between about 30° and about 150°, or between about 60° and about 120°.

61. The method according to any one or more of the preceding paragraphs, wherein the bend is angled at about 45°, about 90° or about 135°.

62. The method according to any one or more of the preceding paragraphs, wherein the bend is semi-circular.

63. The method according to any one or more of the preceding paragraphs, wherein each respective conduit is circular in cross section.

64. The method according to any one or more of the preceding paragraphs, wherein each respective conduit is of the same cross-sectional area.

65. The method according to any one or more of the preceding paragraphs, wherein the inert gas is helium, nitrogen, argon or neon, or a combination thereof.

66. The method according to any one or more of the preceding paragraphs, wherein the feed material is in contact with the hydrocarbon gas at a temperature of from about 600° C. to about 1200° C.

67. The method according to any one or more of the preceding paragraphs, wherein the feed material is in contact with the hydrocarbon gas at a temperature of about 1000° C.

68. The method according to any one or more of the preceding paragraphs, wherein the feed material is in contact with the hydrocarbon gas at a pressure of from about 25 kPag to about 75 kPag.

69. The method according to any one or more of the preceding paragraphs, wherein the feed material is in contact with the hydrocarbon gas at a pressure of 50 kPag.

70. The method according to any one or more of the preceding paragraphs, wherein the hydrocarbon gas is an aliphatic or aromatic hydrocarbon, and may optionally contain one or more nitrogen atoms, selected from the group consisting of methane, ethane, ethylene, propane, propene, acetylene, butane, methylamine, dimethylamine, trimethylamine, ethylamine, diethylamine, triethylamine acetonitrile, pyrrole, quinoline, isoquinoline, acridine, pyrazine, quinoxaline, imidazole, benzimidazole, purine, pyrazole, indazole, pyrimidine quinazoline, pyrimidine, quinazoline, pyridazine, cinnoline, pyridine, dimethylformamide (DMF), nitromethane, benzene, toluene, xylene and combinations thereof, preferably methane or short-chain hydrocarbons.

71. The method according to any one or more of the preceding paragraphs, wherein the hydrocarbon gas is propane.

72. The method according to any one or more of the preceding paragraphs, further comprising a step of feeding the feed material to the reactor using a feed control system.

73. The method according to any one or more of the preceding paragraphs, wherein the feed control system comprises a compartment where the feed material is fluidised and introduced into the reactor by a supply of carrier gas.

74. The method according to any one or more of the preceding paragraphs, wherein the carrier gas comprises helium, nitrogen, argon or neon, or a combination thereof.

75. The method according to any one or more of the preceding paragraphs, wherein the carrier gas further comprises about 5% v/v hydrogen.

76. The method according to any one or more of the preceding paragraphs, wherein the carrier gas is pre-heated.

77. The method according to any one or more of the preceding paragraphs, wherein the carrier gas is pre-heated by receiving heat from the particulate material and spent carrier gases in a heat exchanger.

78. The method according to any one or more of the preceding paragraphs, wherein the heat exchanger is a pipe-in-pipe heat exchanger.

79. The method according to any one or more of the preceding paragraphs, wherein the feed material is fed in batches.

80. The method according to any one or more of the preceding paragraphs, wherein the feed material is fed in batches using a lock hopper.

81. The method according to any one or more of the preceding paragraphs, wherein the feed material is fed continuously.

82. The method according to any one or more of the preceding paragraphs, wherein the feed material is fed at a rate of from about 0.1 kg/h to about 10 kg/h.

83. The method according to any one or more of the preceding paragraphs, wherein the feed material is fed at about 5 kg/h.

84. The method according to any one or more of the preceding paragraphs, wherein the reactor further comprises heating means to heat the reactor.

85. The method according to any one or more of the preceding paragraphs, wherein the heating means comprises a burner for burning a mixture of a gaseous fuel and air.

86. The method according to any one or more of the preceding paragraphs, wherein the heating means comprises an electrically heated furnace.

87. The method according to any one or more of the preceding paragraphs, further comprising a step of separating the particulate material from gas using separation means in fluid communication with the outlet conduit.

88. The method according to any one or more of the preceding paragraphs, wherein the separation means comprises a sintered metal filter.

89. The method according to any one or more of the preceding paragraphs, wherein the separated gas is recycled back to the reactor.

90. The method according to any one or more of the preceding paragraphs, wherein the separated gas is compressed prior to recycling.

91. A particulate material obtained or obtainable from a method according to any one or more of the preceding paragraphs.

92. The particulate material according to any one or more of the preceding paragraphs, wherein the material is silicon particles or silicon carbide particles coated with at least one layer of carbonaceous material.

93. The particulate material according to any one or more of the preceding paragraphs, wherein the silicon particles or silicon carbide particles are coated with one layer of carbonaceous material, the layer having a thickness of about 0.1 nm to about 100 nm or about 0.025% to about 1000% of the particle size, preferably about 5 nm to about 30 nm or about 1.25% to about 300% of the particle size, more preferably about 5 nm to about 20 nm or about 1.25% to about 200% of the particle size.

94. The particulate material according to any one or more of the preceding paragraphs, wherein the silicon particles or silicon carbide particles are coated with two layers of carbonaceous material, the layers having a thickness of about 0.1 nm to about 400 nm or about 0.025% to about 4000% of the particle size, preferably about 100 nm to about 300 nm or about 25% to about 3000% of the particle size, more preferably about 100 nm to about 250 nm or about 25% to about 2500% of the particle size, particularly preferably about 100 nm to about 200 nm or about 25% to about 2000% of the particle size.

95. The particulate material according to any one or more of the preceding paragraphs, wherein the coated silicon particles comprise silicon nano-particles coated with graphite and/or silicon nano-particles coated with carbon.

96. The particulate material according to any one or more of the preceding paragraphs, wherein the coated silicon particle comprises about 3% to about 20% of the carbonaceous material, preferably graphite, amorphous carbon and/or a mixture thereof.

97. The particulate material according to any one or more of the preceding paragraphs, wherein the coated silicon particles are in the form of clusters and/or agglomerates.

98. Use of a particulate material according to any one or more of the preceding paragraphs for preparing an electrode material.

99. An electrode material comprising a particulate material according to any one or more of the preceding paragraphs.

100. Use of an electrode material according to any one or more of the preceding paragraphs for preparing an electrode of an alkali metal-ion battery.

101. An electrode of an alkali metal-ion battery, the electrode comprising an electrode material according to any one or more of the preceding paragraphs.

102. Use of an electrode according to any one or more of the preceding paragraphs for preparing an alkali metal-ion battery.

103. An alkali metal-ion battery comprising an electrode according to any one or more of the preceding paragraphs.

104. Use according to any one or more of the preceding paragraphs, the electrode according to any one or more of the preceding paragraphs, or the battery according to any one or more of the preceding paragraphs, wherein the alkali metal-ion battery is a lithium-ion battery, a sodium-ion battery, or a potassium-ion battery.

What is claimed is:

1. A CVD reactor for preparing a particulate material from a feed material, the reactor comprising:

a first inlet conduit; and a first bend having one end located at the end of the first inlet conduit, and another end located at the start of a first outlet conduit, further comprising n bends, wherein each bend comprises an $n+1^{th}$ inlet conduit and an $n+1^{th}$ outlet conduit, wherein an nth outlet conduit is in fluid communication with and defines an $n+1^{th}$ inlet conduit, wherein the particulate material is prepared by flowing the feed material through the inlet conduits and the outlet conduits while in contact with a hydrocarbon gas under a flowing inert gas at a temperature of between about 500° C. to about 1500° C., wherein the longitudinal axes of inlet conduits and the outlet conduits are arranged in a vertical orientation, and wherein the first inlet conduit has a downward opening such that the feed material flows upwardly in the first inlet conduit.

2. The CVD reactor according to claim 1, wherein the feed material has a residence time of from about 4 minutes to about 100 minutes in the CVD reactor.

3. The CVD reactor according to claim 1, wherein the feed material is selected from the group consisting of carbonaceous particulate materials, metallic lithium, lithium titanate, tin-based alloys, cathode materials, silicon-carbon based materials and silicon-based materials.

4. The CVD reactor according to claim 1, comprising one or more inert gas inlets along the inlet and/or outlet conduits for introducing the inert gas into the CVD reactor.

5. The CVD reactor according to claim 1, wherein the bend is angled at between about 0° and about 180°, or between about 30° and about 150°, or between about 60° and about 120°.

6. The CVD reactor according to claim 1, wherein the feed material is in contact with the hydrocarbon gas at a pressure of from about 25 kPag to about 75 kPag.

7. The CVD reactor according to claim 1, further comprising a feed control system for feeding the feed material to the CVD reactor, wherein the feed control system comprises a compartment where the feed material is fluidized and introduced into the CVD reactor by a supply of carrier gas.

8. The CVD reactor according to claim 1, further comprising heating means to heat the CVD reactor.

9. The CVD reactor according to claim 1, further comprising separation means in fluid communication with the outlet conduit for separating the particulate material from gas.

10. The CVD reactor according to claim 1, wherein the CVD reactor is arranged in a vertical orientation.

11. The CVD reactor according to claim 1, wherein the end of the n+1th outlet conduit of the CVD reactor is the only exit for a mixture of the prepared particulate material, any unreacted feed material, any unreacted hydrocarbon gas and the inert gas.

12. The CVD reactor according to claim 1, wherein the CVD reactor is arranged in a vertical orientation, and wherein the end of the n+1th outlet conduit of the CVD reactor is the only exit for a mixture of the prepared particulate material, any unreacted feed material, any unreacted hydrocarbon gas and the inert gas.

* * * * *